US012005482B2

(12) United States Patent
Demura et al.

(10) Patent No.: US 12,005,482 B2
(45) Date of Patent: Jun. 11, 2024

(54) SUBSTRATE TREATMENT DEVICE

(71) Applicant: Shibaura Mechatronics Corporation, Yokohama (JP)

(72) Inventors: Kensuke Demura, Yokohama (JP); Daisuke Matsushima, Yokohama (JP); Masaya Kamiya, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 221 days.

(21) Appl. No.: 17/195,924

(22) Filed: Mar. 9, 2021

(65) Prior Publication Data
US 2021/0299713 A1 Sep. 30, 2021

(30) Foreign Application Priority Data

Mar. 31, 2020 (JP) .................................. 2020-062170
Jan. 8, 2021 (JP) .................................. 2021-001890

(51) Int. Cl.
*H01L 21/67* (2006.01)
*B08B 3/10* (2006.01)
*B08B 7/00* (2006.01)

(52) U.S. Cl.
CPC .............. *B08B 7/0092* (2013.01); *B08B 3/10* (2013.01); *H01L 21/67051* (2013.01)

(58) Field of Classification Search
CPC ... B08B 3/10; B08B 7/0092; H01L 21/02041; H01L 21/02043; H01L 21/020252; H01L 21/02054; H01L 21/0209; H01L 21/67017; H01L 21/67023; H01L 21/67034; H01L 21/6704; H01L 21/67051; H01L 21/67098;
(Continued)

(56) References Cited

U.S. PATENT DOCUMENTS

2014/0311676 A1 10/2014 Hatoh et al.
2015/0090302 A1 4/2015 Fujiwara et al.
(Continued)

FOREIGN PATENT DOCUMENTS

JP 2018-026436 A 2/2018
JP 2020-080350 A 5/2020
(Continued)

OTHER PUBLICATIONS

Machine Translation of Hasegawa et al., WO-2018179945-A1, Oct. 2018. (Year: 2018).*

*Primary Examiner* — David G Cormier
(74) *Attorney, Agent, or Firm* — PEARNE & GORDON LLP

(57) ABSTRACT

According to one embodiment, q substrate treatment device includes a placement stand, a plurality of support portions, a cooling part, a liquid supplier, and at least one protrusion. The placement stand has a plate shape, and is configured to rotate. The support portions are provided on one surface of the placement stand and configured to support a substrate. The cooling part is configured to supply a cooling gas into a space between the placement stand and a back surface of the substrate supported by the support portions. The liquid supplier is configured to supply a liquid onto a surface of the substrate. At least one protrusion is provided on the one surface of the placement stand and extends along a boundary line of a region where the substrate is provided in a plan view.

5 Claims, 8 Drawing Sheets

(58) Field of Classification Search
CPC ............. H01L 21/67109; H01L 21/687; H01L 21/68714; H01L 21/68735; H01L 21/68742; H01L 21/6875; H01L 21/68785
See application file for complete search history.

(56) References Cited

U.S. PATENT DOCUMENTS

| | | |
|---|---|---|
| 2018/0047559 A1 | 2/2018 | Kamiya et al. |
| 2018/0200764 A1* | 7/2018 | Fukui ........................ B08B 7/04 |
| 2020/0147655 A1 | 5/2020 | Takai |

FOREIGN PATENT DOCUMENTS

| | | | |
|---|---|---|---|
| KR | 10-2014-0058391 A | 5/2014 | |
| TW | I571929 B | 2/2017 | |
| TW | I597770 B | 9/2017 | |
| WO | WO-2018179945 A1 * | 10/2018 | ........... H01L 21/304 |

* cited by examiner

SUBSTRATE TREATMENT DEVICE

CROSS-REFERENCE TO RELATED APPLICATIONS

This application is based upon and claims the benefit of priority from Japanese Patent Application No. 2020-062170, filed on Mar. 31, 2020, and No. 2021-001890, filed on Jan. 8, 2021; the entire contents of which are incorporated herein by reference.

FIELD

Embodiments described herein relate generally to a substrate treatment device.

BACKGROUND

A freeze-cleaning method has been proposed as a method for removing contaminations such as particles adhering to the surface of a substrate such as an imprint template, a photolithography mask, and a semiconductor wafer.

In the freeze-cleaning method, for example, when pure water is used as the liquid used for cleaning, the pure water and cooling gas are first supplied to the surface of the rotated substrate. Next, the supply of pure water is stopped, and a part of the supplied pure water is discharged to form a water film on the surface of the substrate. The water film is frozen by the cooling gas supplied to the substrate. When the water film freezes and an ice film is formed, contaminations such as particles are taken into the ice film and separated from the surface of the substrate. Next, pure water is supplied to the ice film to melt the ice film, and contaminations are removed from the surface of the substrate together with the pure water.

However, since the vicinity of the peripheral edge of the substrate is adjacent to an external atmosphere not only in a direction perpendicular to the surface of the substrate but also in a direction parallel to the surface of the substrate, the amount of heat input from the outside increases. Therefore, the temperature in the vicinity of the peripheral edge of the substrate tends to be higher than that in the central region of the substrate. When the temperature in the vicinity of the peripheral edge of the substrate is high, formation of the ice film in the vicinity of the peripheral edge of the substrate is suppressed, and the removal ratio of contaminants in the vicinity of the peripheral edge of the substrate may decrease.

Therefore, it has been desired to develop a substrate treatment device capable of suppressing an increase of the temperature in the vicinity of the peripheral edge of the substrate.

DETAILED DESCRIPTION

Figure 1:
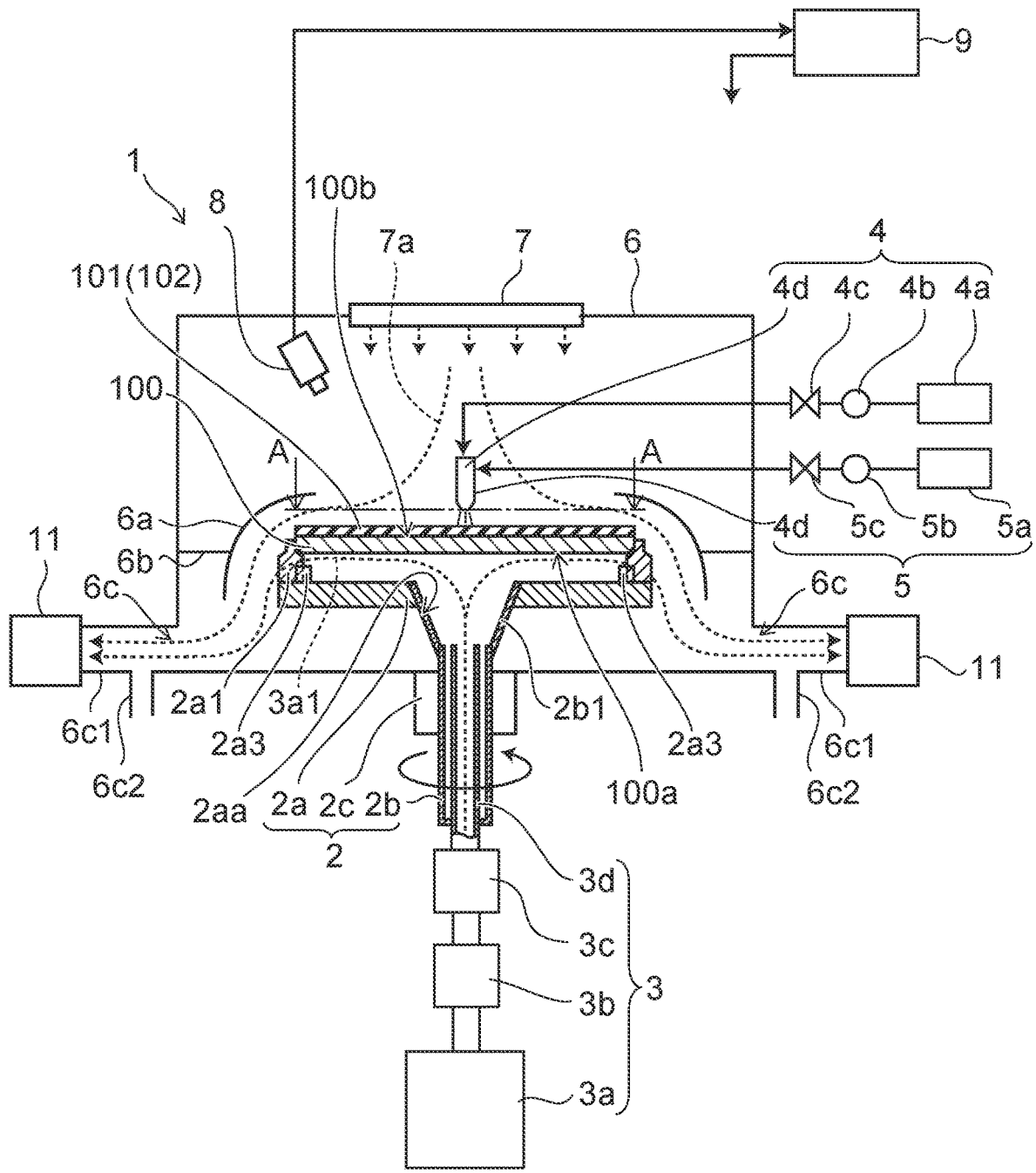
FIG. 1 is a schematic view for illustrating a substrate treatment device according to the embodiment.

According to one embodiment, a substrate treatment device includes a placement stand, a plurality of support portions, a cooling part, a liquid supplier, and at least one protrusion. The placement stand has a plate shape, and is configured to rotate. The support portions are provided on one surface of the placement stand and configured to support a substrate. The cooling part is configured to supply a cooling gas into a space between the placement stand and a back surface of the substrate supported by the support portions. The liquid supplier is configured to supply a liquid onto a surface of the substrate. At least one protrusion is provided on the one surface of the placement stand and extends along a boundary line of a region where the substrate is provided in a plan view.

Various embodiments are described below with reference to the accompanying drawings.

In the specification and drawings, similar components are marked with like reference numerals, and a detailed description is omitted as appropriate.

The substrate 100 illustrated below can be, for example, a semiconductor wafer, an imprint template, a photolithography mask, a plate-like body used for MEMS (Micro Electro Mechanical Systems), or the like. However, the use of the substrate 100 is not limited to these. Further, the substrate 100 may have uneven portions on the surface thereof.

Further, in the following, as an example, a case where the substrate 100 is a mask for photolithography will be described. When the substrate 100 is a mask for photolithography, the planar shape of the substrate 100 can be a substantially quadrangle. An uneven portion, which is a mask pattern, is formed on the surface of the substrate 100.

FIG. 1 is a schematic view for illustrating a substrate treatment device 1 according to the embodiment.

Figure 2A:
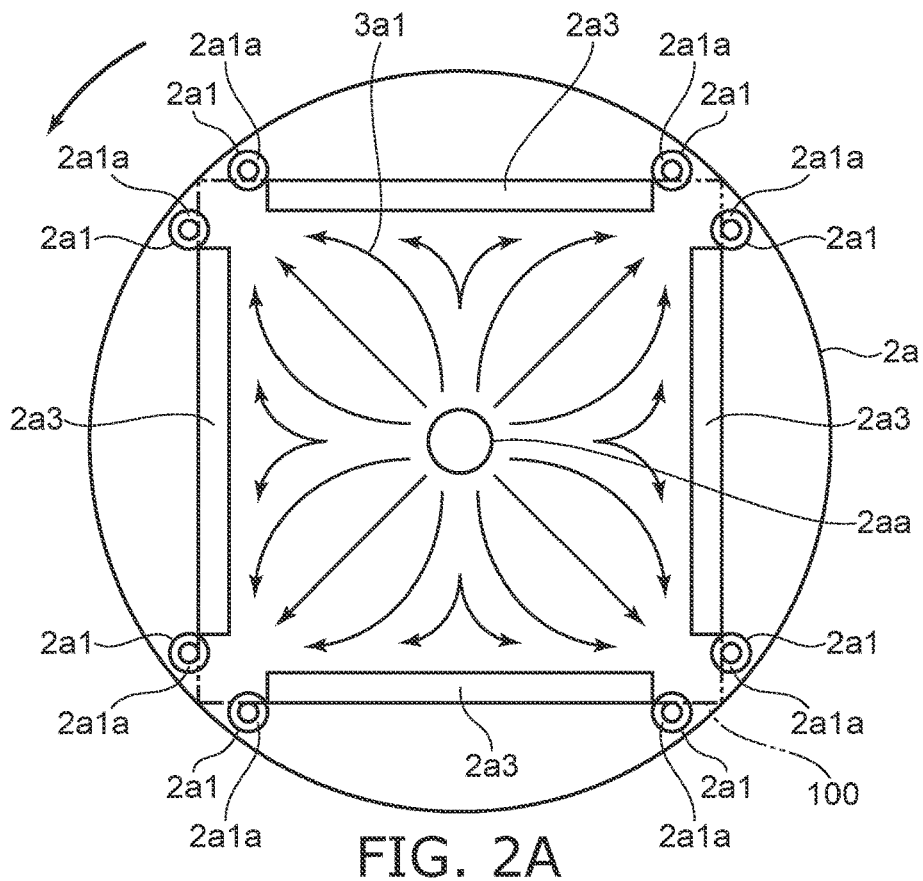
FIG. 2A is a schematic view along A-A line of a placement part in FIG. 1.
Figure 2B:
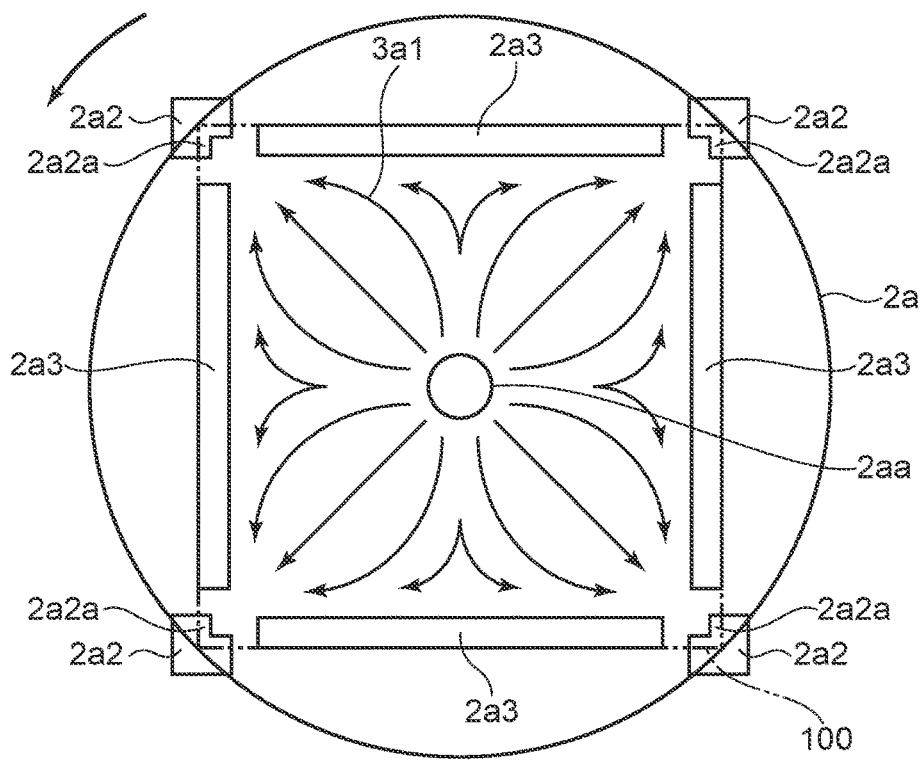
FIG. 2B is a schematic view for illustrating a support portion according to an other embodiment.

FIG. 2A is a schematic view along A-A line of a placement part 2 in FIG. 1, FIG. 2B is a schematic view for illustrating a support portion 2a2 according to an other embodiment.

Figure 3A:
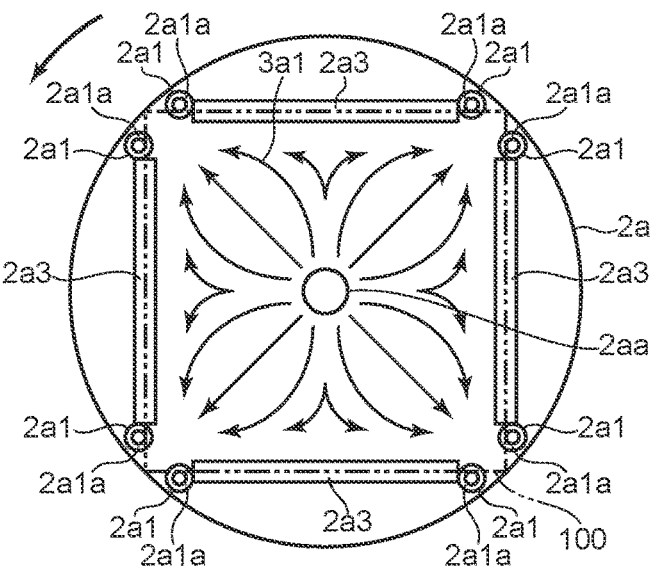
FIGS. 3A to 3C are schematic views for illustrating arrangement of protrusions according to the other embodiment.
Figure 3B:
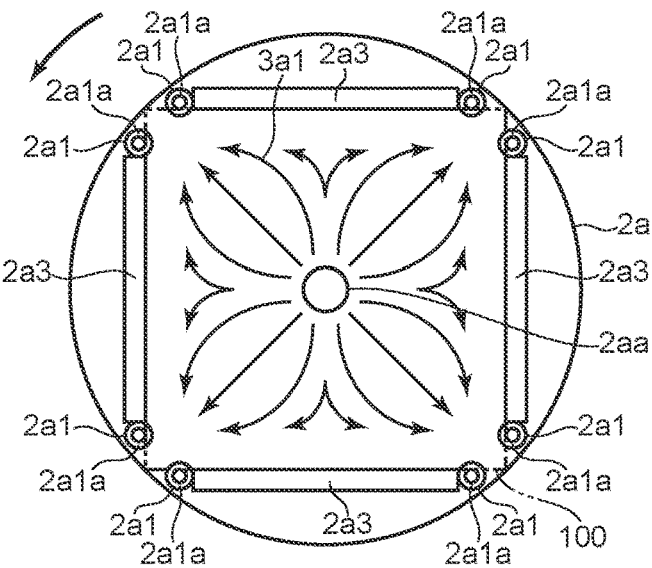
Figure 3C:
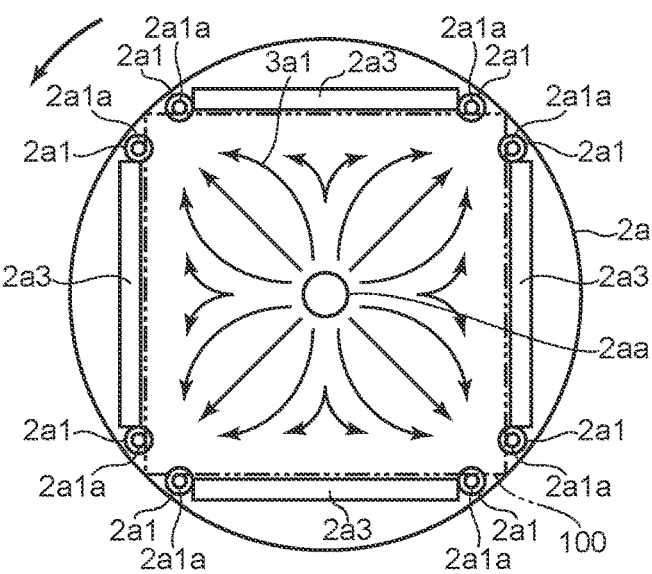

FIGS. 3A to 3C are schematic views for illustrating arrangement of protrusions 2a3 according to the other embodiment.

Figure 4A:
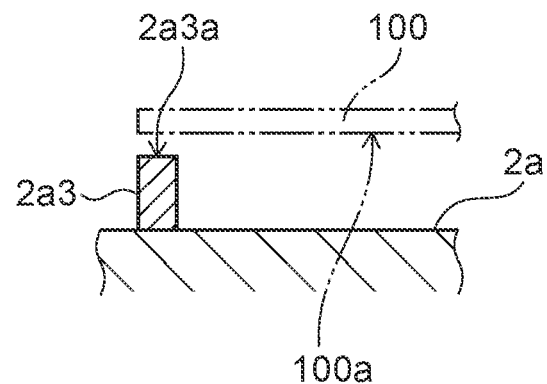
FIGS. 4A and 4B are schematic views for illustrating positions a top of the protrusion.
Figure 4B:
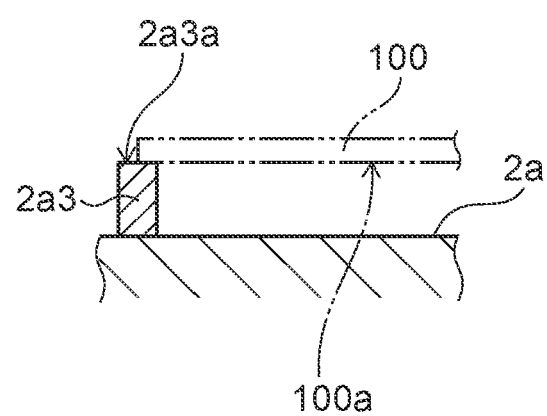

FIGS. 4A and 4B are schematic views for illustrating positions a top of the protrusion 2a3.

As shown in FIG. 1, the substrate treatment device 1 includes a placement part 2, a cooling part 3, a first liquid supplier 4, a second liquid supplier 5, a housing 6, a blower part 7, a measurement part 8, and a controller 9, and an exhaust part 11.

The placement part 2 includes a placement stand 2a, a rotation axis 2b, and a drive part 2c.

The placement stand 2a is rotatably provided inside the housing 6. The placement stand 2a has a plate shape. Multiple support portions 2a1 for supporting the substrate 100 are provided on one major surface of the placement stand 2a. When the substrate 100 is supported by the multiple support portions 2a1, the surface 100b (the surface on which the uneven portion is formed) of the substrate 100 faces a direction opposite to the placement stand 2a side.

The edges of the back surface 100a of the substrate 100 come into contact with the multiple support portions 2a1. As shown in FIGS. 1 and 2A, the portion of the support portion 2a1 that comes into contact with the edge of the back surface 100a of the substrate 100 can be a tapered surface 2a1a. If the portion of the support portion 2a1 that contacts the edge of the back surface 100a of the substrate 100 is the tapered surface 2a1a, the support portion 2a1 and the edge of the back surface 100a of the substrate 100 can be brought into point contact, therefore, it is possible to suppress the substrate 100 from being soiled or damaged.

As shown in FIG. 2B, the portion of the support portion 2a2 that comes into contact with the edge of the back surface 100a of the substrate 100 can also be an inclined surface 2a2a. If the portion of the support portion 2a2 that contacts the edge of the back surface 100a of the substrate 100 is the inclined surface 2a2a, the support portion 2a2 and the edge of the back surface 100a of the substrate 100 can be brought into line contact, therefore, it is possible to suppress the substrate 100 from being soiled or damaged.

Further, a hole 2aa piercing the thickness direction of the placement stand 2a is provided in the central portion of the placement stand 2a. Unless otherwise specified, it is argued that the center of the hole 2aa and the center of the substrate 100 are at the same position in a plan view. The center of the substrate 100 is the center of the inscribed circle when the inscribed circle exists inside the substrate 100, and the center of the substrate 100 is the center of gravity when the inscribed circle does not exist inside the substrate 100.

Further, at least one protrusion 2a3 can be provided on one main surface of the placement stand 2a. Multiple protrusions 2a3 illustrated in FIGS. 1 and 2A and 2B are provided. For example, the protrusions 2a3 can be provided at a position where at least a part of the protrusions 2a3 overlaps the peripheral edge (outer periphery) of the substrate 100 in a plan view (when viewed from a direction perpendicular to one main surface of the placement stand 2a). When the planar shape of the substrate 100 is quadrangular, it is possible to prevent the protrusions 2a3 from being provided at the corner positions of the substrate 100 in a plan view.

In a plan view (viewed from a direction perpendicular to one main surface of the placement stand 2a), the area where the substrate 100 supported on the placement stand 2a and the placement stand 2a overlap is defined as the region where the substrate 100 is provided. At that time, the protrusion 2a3 can have a shape extending along the boundary line of the region where the substrate 100 is provided (a shape extending along the peripheral edge of the placed substrate 100). When the planar shape of the substrate 100 is quadrangular, in a plan view, the protrusion 2a3 is formed between the vicinity of one corner of the placed substrate 100 and the vicinity of the corner adjacent to the corner of the substrate 100. The protrusion 2a3 can have a shape that extends along the peripheral edge of the substrate 100. That is, the protrusions 2a3 can have a shape extending along each side at the position of each side of the substrate 100. When the protrusions 2a3 are not provided at the corners of the substrate 100, the four protrusions 2a3 corresponding to the four sides of the substrate 100 will be provided.

Further, the protrusions 2a3 may be a square frame composed of one protrusion provided at a position corresponding to each side of the substrate 100 including the corners. That is, the protrusion 2a3 may be one frame-shaped protrusion. In this case, the substrate 100 may be supported at a corner or at an arbitrary position.

As described later, when the cooling gas 3a1 is supplied to the central portion of the substrate 100, the cooling gas 3a1 is supplied to the space surrounded by the back surface 100a of the substrate 100, the placement stand 2a, and the protrusions 2a3. The protrusions 2a3 restrict the cooling gas 3a1 supplied to the central portion of the substrate 100 from spreading toward the peripheral edge of the substrate 100 and flowing out of the peripheral edge of the substrate 100. In this way, the protrusion 2a3 only needs to be able to restrict the flow of the cooling gas 3a1 not to flow the outside of the substrate 100. For example, in the case of the support portion 2a2 shown in FIG. 2B, even in the support portion 2a2, such a support portion 2a2 can also be regarded as a protrusion because the cooling gas 3a1 can be restricted from flowing out of the substrate 100 from the corner of the substrate 100. Similarly, even in the support portion 2a1, the gap between the adjacent support portions 2a1 is a space through which the cooling gas 3a1 flows. Therefore, if this gap is narrow to some extent, the support portion 2a1 can also be regarded as a protrusion because the cooling gas 3a1 can be restricted from flowing to the outside of the peripheral edge of the substrate 100.

As shown in FIGS. 2A and 2B, in a plan view, the multiple protrusions 2a3 can be provided inside the region where the substrate 100 is provided. At this time, the outside of the protrusion 2a3 does not necessarily have to coincide with the boundary line of the region where the substrate 100 is provided, and a slight gap (for example, 1 mm or less) may be provided from the boundary line of the region where the substrate 100 is provided.

Further, as shown in FIG. 3A, in a plan view, a portion of the protrusion 2a3 may be provided inside the region where the substrate 100 is provided, and the remaining portion may be provided outside the region where the substrate 100 is provided.

Further, in a plan view, the protrusions 2a3 can be located in the vicinity of the region where the substrate 100 is provided.

For example, as shown in FIGS. 3B and 3C, the multiple protrusions 2a3 may be provided outside the region where the substrate 100 is provided in a plan view. In this case, as shown in FIG. 3B, the surfaces of the multiple protrusions 2a3 on the substrate 100 side may be located on the boundary line of the region where the substrate 100 is provided. Further, as shown in FIG. 3C, a slight gap (for example, 1 mm or less) may be provided between the surface of the multiple protrusions 2a3 on the substrate 100 side and the boundary line of the region where the substrate 100 is provided.

As shown in FIG. 4A, a slight gap (for example, 1 mm or less) may be provided between the top portion 2a3a of the protrusion 2a3 and the back surface 100a of the substrate 100. Further, as shown in FIG. 4B, at least a part of the top portion 2a3a of the protrusion 2a3 may be brought into contact with the back surface 100a of the substrate 100.

The dimension of the gap between the top portion 2a3a of the protrusion 2a3 and the back surface 100a of the substrate 100 may be determined in advance by an experiment or the like so that the temperature near the peripheral edge of the substrate 100 becomes appropriate. For example, the flow rate of the cooling gas 3a1, the rotation speed of the substrate 100, the supply amount of the liquid 101, and the like may be used as parameters to determine the size of the gap so that the in-plane temperature distribution of the substrate 100 approaches evenly.

Further, the gaps need not to be provided evenly with respect to the peripheral edge of the substrate 100. Even if the gaps are evenly provided with respect to the peripheral edge of the substrate 100, the in-plane temperature of the substrate 100 is not always uniform depending on the shape and size of the substrate 100, the positions of the support portions 2a1 and 2a2, and the like. Therefore, the arrangement of the gap may be determined by conducting the above-mentioned experiment or the like.

Of course, the size of the gap and the arrangement of the gap may be combined. The size of the gap and the arrangement of the gap may be appropriately determined so that the temperature near the peripheral edge of the substrate 100 becomes appropriate. Further, as illustrated in FIGS. 3B and 3C, even when the protrusion 2a3 and the substrate 100 do not overlap in a plan view, in the vertical direction, there may be a distance equivalent to a gap between the top portion 2a3a of the protrusion 2a3 and the back surface 100a of the substrate 100. Further, in the case as illustrated in FIG. 3C, the distance between the peripheral edge of the substrate 100 and the protrusion 2a3 can be regarded as a distance corresponding to the gap in a plan view.

For example, the temperature distribution of the substrate 100 to be cooled can be controlled by at least one of the outflow resistance of the cooling gas 3a1 flowing out from the space surrounded by the multiple protrusions 2a3 through the gap, the size of the opening of the gap, and the position of the gap.

Next, the operation of the protrusions 2a3 will be described.

Figure 5:
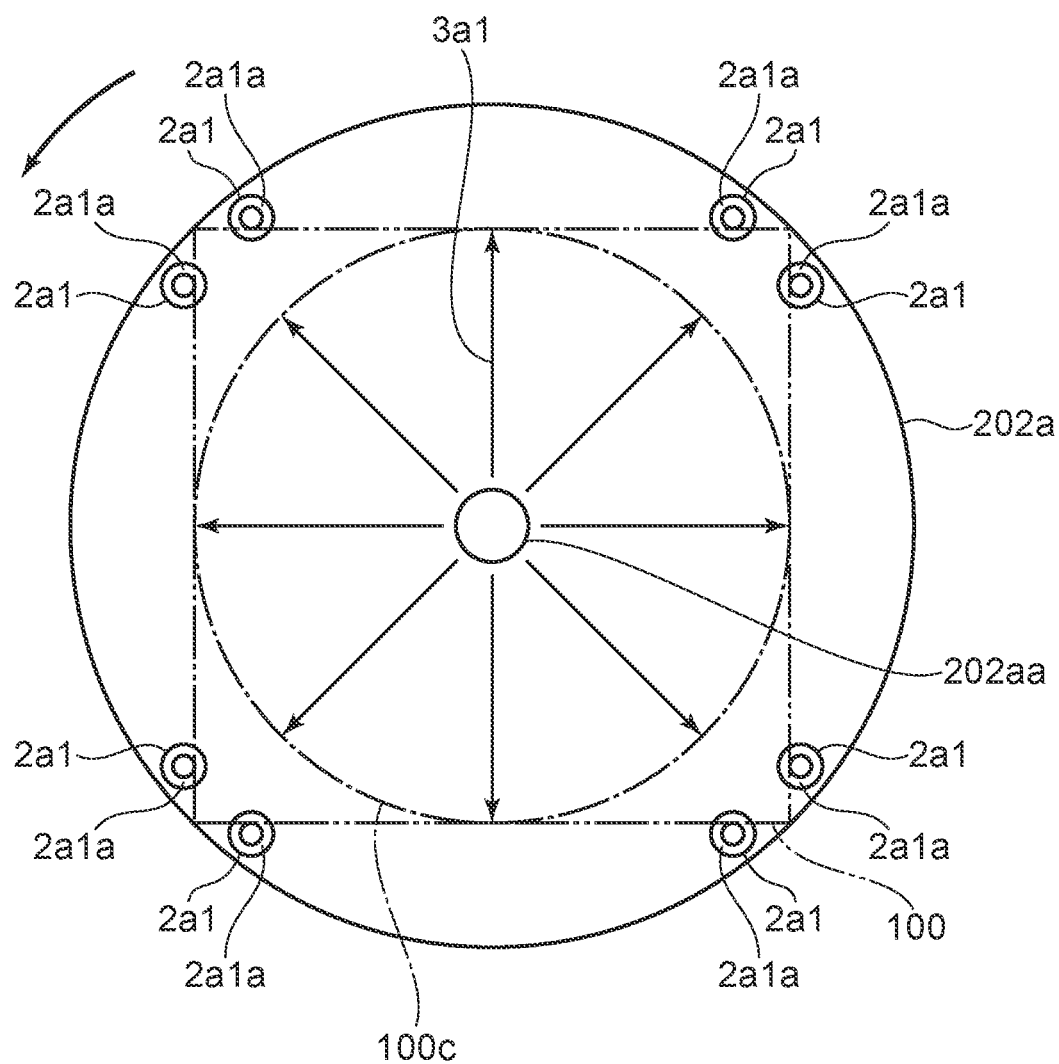
FIG. 5 is a schematic view for illustrating a placement stand according to a comparative example.

FIG. 5 is a schematic diagram for illustrating the placement stand 202a according to a comparative example.

As shown in FIG. 5, multiple support portions 2a1 for supporting the substrate 100 are provided on one main surface of the placement stand 202a. Further, a hole 202aa piercing the placement stand 202a in a thickness direction is provided in the central portion of the placement stand 202a. However, although the placement stand 2a described above is provided with multiple protrusions 2a3, the placement stand 202a is not provided with multiple protrusions 2a3.

As will be described later, the cooling gas 3a1 is supplied from the hole 202aa. The supplied cooling gas 3a1 flows through the space between the placement stand 202a and the back surface 100a of the substrate 100, and is discharged to the outside of the substrate 100. The cooling gas 3a1 removes heat from the substrate 100 to cool the substrate 100. On the other hand, the temperature of the cooling gas 3a1 rises by taking heat from the substrate 100.

Since the flow path resistance in the direction parallel to the plane of the placement stand 202a is substantially the same, the cooling gas 3a1 flows substantially radially from the hole 202aa as shown in FIG. 5. Since the cooling gas 3a1 flows in substantially one direction while taking heat from the substrate 100, the temperature of the cooling gas 3a1 rises toward the peripheral edge side of the substrate 100 and the cooling efficiency decreases. Further, since the vicinity of the peripheral edge of the substrate 100 is adjacent to the external atmosphere not only in the direction perpendicular to the surface 100b of the substrate 100 but also in the direction parallel to the surface 100b of the substrate 100, the amount of heat input from the outside increases. Therefore, cooling in the vicinity of the peripheral edge of the substrate 100 is suppressed.

By the way, in the case of the substrate 100 having a square planar shape, the circle in contact with the side of the substrate 100 is the inscribed circle 100c. The inscribed circle 100c is in contact with the central portion of each side of the square. However, in the case of the substrate 100 having a rectangular planar shape, the circle in contact with the side of the substrate 100 is not an inscribed circle. The radius of the circle in contact with the side of the substrate 100 is the shortest distance connecting the center of the substrate 100 and one side of the rectangle. At this time, the circle existing inside the substrate 100 and in contact with the side of the substrate 100 is in contact with the long side of the rectangle. As described above, the inscribed circle may not exist inside the substrate 100. However, in order to simplify the description, in the embodiment, a circle existing inside the substrate 100 and having the radius of the line connecting the center of the substrate 100 and one side of the substrate 100 at the shortest is called the "inscribed circle".

As shown in FIG. 5, the substrate 100 rotates about the hole 202aa. When the planar shape of the substrate 100 is quadrangular, the opening of the space between the back surface 100a of the substrate 100 and the placement stand 202a inside the inscribed circle 100c in contact with the side of the substrate 100 moves on the inscribed circle 100c, and does not move in the external atmosphere. Therefore, the intrusion of outside air due to the rotation of the substrate 100 is small. On the other hand, the opening of the space between the back surface 100a of the substrate 100 and the placement stand 202a on the outside of the inscribed circle 100c, that is, the space near the corner of the quadrangle moves in the external atmosphere, so that with rotation of the substrate 100, the outside air easily enters in the tangential direction of the inscribed circle 100c. Therefore, when the planar shape of the substrate 100 is quadrangular, in addition to suppressing cooling in the vicinity of the peripheral edge of the substrate 100, cooling in the vicinity of the corners of the substrate 100 is further suppressed.

The opening of the space between the back surface 100a of the substrate 100 and the placement stand 202a described above is a portion such that the space between the back surface 100a of the substrate 100 and the mounting table 202a ends at the position of the peripheral edge (outer periphery) of the substrate 100. That is, the opening of the space between the back surface 100a of the substrate 100 and the placement stand 202a (hereinafter, simply referred to as "opening") is a portion such that the space between the mounting table 2a and the back surface 100a of the substrate 100 faces the outside of the substrate 100. Therefore, the position of the opening is the same as that on the boundary line of the region where the substrate 100 is provided.

In the case of the substrate 100 having a quadrangular plane shape, openings are provided at each side position of the quadrangle in a plan view.

As described above, the "opening" near the portion where the inscribed circle 100c and the side of the substrate 100 contact moves on the inscribed circle 100c and does not move in the outside atmosphere, when the substrate 100 is rotated around the center of the substrate 100 (at the center of the inscribed circle). Therefore, the atmosphere outside the substrate 100 is unlikely to flow into the space between the back surface 100a of the substrate 100 and the placement stand 2a through the "opening" near the portion where the inscribed circle and the side of the substrate are in contact with each other. On the other hand, the corners of the quadrangular substrate 100 (for example, other than the vicinity of the central portion of each side of the square substrate 100) diagonally cross the external atmosphere in the rotational movement direction when the square substrate 100 is rotationally moved. As a result, the atmosphere outside the substrate 100 flows into the space between the vicinity of the corner of the back surface 100a of the substrate 100 and the placement stand 2a. Since the atmosphere outside the substrate 100 is not cooled, the inflowing atmosphere suppresses the cooling of the substrate 100.

Further, as described above, when the quadrangular substrate 100 is rotated, an uncooled atmosphere flows into the vicinity of the corners of the substrate 100, and cooling in the vicinity of the corners of the substrate 100 is suppressed. However, if the protrusions 2a3 are present near the corners of the substrate 100, the inflow of the atmosphere is blocked or restricted, so that it is suppressed becoming difficult to be cooled in the vicinity of the corners of the substrate 100 due to the inflow of the uncooled atmosphere.

The cooling gas 3a1 is discharged from the space between the substrate 100 and the placement stand 2a not only near the corners of the substrate 100 but also at the peripheral edge of the substrate 100. If the protrusions 2a3 are not provided, the contact time of the cooling gas 3a1 is short and the amount of heat input is large in the vicinity of the peripheral edge of the substrate 100, so that cooling is suppressed as in the vicinity of the corners of the substrate 100. If the protrusions 2a3 are provided, the cooling gas 3a1 stays by the protrusions 2a3, so that the contact time between the vicinity of the peripheral edge of the substrate 100 and the cooling gas 3a1 becomes long, and it is possible to prevent the cooling gas from becoming difficult to cool.

Further, the cooling gas 3a1 sprayed on the center of the back surface 100a of the substrate 100 flows toward the peripheral edge of the substrate 100 along the back surface 100a of the substrate 100. When the substrate 100 is a quadrangle and the substrate 100 is rotated around the center of the substrate 100, the corners of the substrate 100 are farther from the center of rotation than the side portions. Therefore, in the vicinity of the corner of the substrate 100, the peripheral speed becomes high and the cooling gas 3a1 is easily discharged to the outside of the substrate 100. Therefore, the contact time between the vicinity of the corner of the substrate 100 and the cooling gas 3a1 is shorter than the contact time between the vicinity of the side of the substrate 100 and the cooling gas 3a1. If the contact time between the cooling gas 3a1 and the substrate 100 is short, heat exchange between the cooling gas 3a1 and the substrate 100 is not sufficiently performed. Therefore, it becomes difficult to cool the vicinity of the corner of the substrate 100.

Further, since the distance until the cooling gas 3a1 reaches the corner of the substrate 100 is long, the temperature of the cooling gas 3a1 is high. Further, since the distance until the cooling gas 3a1 reaches reach the corner of the substrate 100 is long, the cooling gas 3a1 spreads, and as a result, the efficiency of heat exchange between the substrate 100 and the cooling gas 3a1 decreases, and it becomes difficult to cool the vicinity of the corner of the substrate 100.

The above is the same for the substrate 103 having a circular planar shape, which will be described later. In the case of the substrate 103 having a circular planar shape, the distance from the center of rotation (supply position of the cooling gas 3a1) to the peripheral edge of the substrate 103 is the same, but the cooling gas 3a1 is directed from the center of rotation to the peripheral edge of the substrate 100 and spreads. Since the volume of the space between the back surface 100a of the substrate 100 and the placement stand 2a increases toward the peripheral edge of the substrate 100, the cooling efficiency decreases toward the peripheral edge of the substrate 100. Further, when the substrate 100 is rotated, the peripheral speed is high and the centrifugal force acts strongly in the vicinity of the peripheral edge of the substrate 100, so that the amount of the cooling gas 3a1 discharged to the outside increases, the amount of the cooling gas 3a1 itself decreases, and the contact time becomes short, and then, the peripheral edge is less likely to be cooled. Therefore, even in the case of the substrate 103 having a circular planar shape, if the contact time of the cooling gas 3a1 near the peripheral edge of the substrate 100 is short, the efficiency of the cooling gas 3a1 receiving heat from the substrate 100 (heat exchange efficiency) decreases. Cooling near the peripheral edge of the substrate 100 is suppressed.

On the other hand, the placement stand 2a according to the embodiment is provided with multiple protrusions 2a3. Therefore, as shown in FIGS. 2A to 3C, the cooling gas 3a1 supplied from the hole 2aa is changed in the flow direction by hitting the protrusion 2a3 and becomes to flow along the protrusion 2a3. That is, the cooling gas 3a1 supplied to the space between the placement stand 2a and the back surface 100a of the substrate 100 flows toward the protrusions 2a3. Further, the cooling gas 3a1 that has flowed toward the protrusions 2a3 flows along the protrusions 2a3.

Further, the cooling gas 3a1 sprayed to the center of the back surface 100a of the substrate 100 smoothly flows toward the peripheral edge of the substrate 100 along the back surface 100a of the substrate 100 until it hits the protrusion 2a3, so that the cooling of the substrate 100 is not disturbed until the cooling gas 3a1 reaches the protrusion 2a3.

Since the protrusion 2a3 has a shape extending along the peripheral edge of the placed substrate 100, the cooling gas 3a1 flows along the peripheral edge of the substrate 100. As described above, cooling of the vicinity of the peripheral edge of the substrate 100 is likely to be suppressed due to a decrease in cooling efficiency or heat input from the external air, but if the protrusion 2a3 is provided, since the cooling gas 3a1 can be flown along the peripheral edge of the substrate 100, it becomes possible to effectively cool the vicinity of the peripheral edge of the substrate 100.

In a plan view, if the protrusions 2a3 are inside the substrate 100, when the liquid 101 is supplied to the substrate 100, the liquid 101 is less likely to enter the portion surrounded by the protrusions 2a3. Even if the liquid 101 enters, the liquid 101 can be discharged through a discharge port (not shown) provided on the placement stand 2a.

Further, as shown in FIGS. 2A and 3A to 3C, in a plan view, the protrusions 2a3 are not provided at the corners of the mounted substrate 100, and a gap (opening) is provided. If so, the cooling gas 3a1 can be collected from this opening and discharged to the outside from the space near the corner of the substrate 100. As described above, the external air easily enters the space near the corner of the substrate 100, but if the cooling gas 3a1 is collected and discharged, the external air can be suppressed from entering. Therefore, it becomes possible to effectively cool the vicinity of the corners of the substrate 100.

As described above, the concentration (flow rate) of the cooling gas 3a1 diminishes as it approaches corners farther from the center of rotation, but if the cooling gas 3a1 can be collected, the cooling gas 3a1 having the concentration (flow rate) sufficient to remove heat from the substrate 100 can be secured. Therefore, it is possible to suppress the vicinity of the corners of the substrate 100 from becoming difficult to be cooled.

As described above, the protrusions 2a3 may be any as long as the cooling gas 3a1 can be in contact with the substrate 100 for a certain length of time.

Figure 6A:
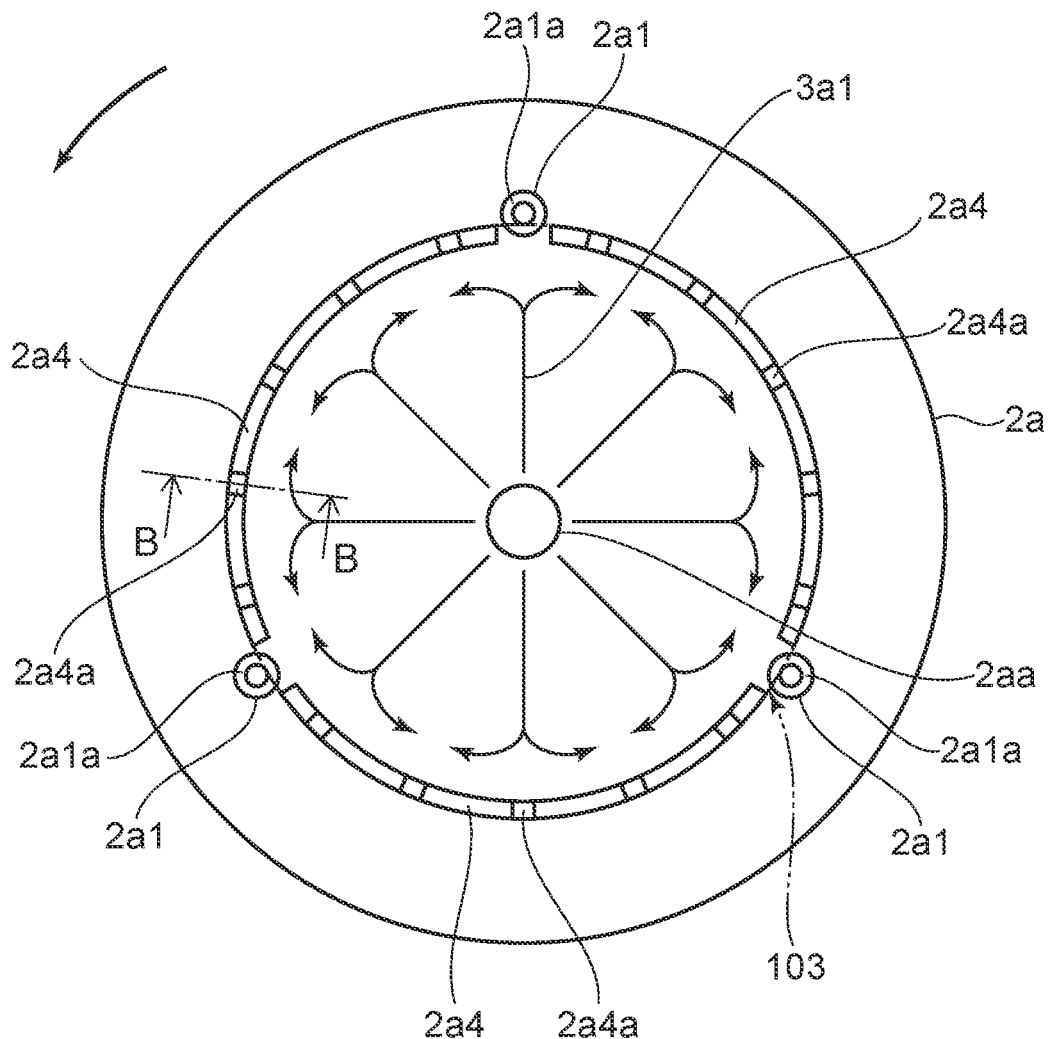
FIGS. 6A and 6B are schematic views for illustrating protrusions according to the other embodiment.
Figure 6B:
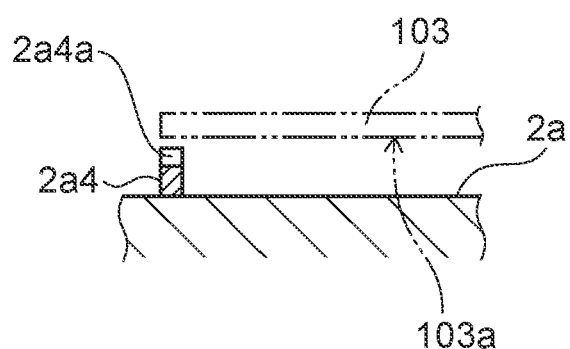

FIGS. 6A and 6B are schematic views for illustrating the protrusions 2a4 according to the other embodiment.

FIG. 6B is a schematic cross-sectional view of the protrusion 2a4 in the B-B line direction in FIG. 6A.

Although the planar shape of the substrate 100 described above was quadrangular, as shown in FIG. 6A, the planar shape of the substrate 103 can also be circular. The substrate 103 can be, for example, a semiconductor wafer or the like.

At least one protrusion 2a4 can be provided on one main surface of the placement stand 2a. Multiple protrusions 2a4 illustrated in FIGS. 6A and 6B are provided. For example, the protrusion 2a4 can be provided at a position where at least a part of the protrusion 2a4 overlaps the peripheral edge (outer periphery) of the substrate 103 in a plan view. As shown in FIG. 6A, in a plan view, the multiple protrusions 2a4 can be provided inside the region where the substrate 103 is provided. The protrusion 2a4 may be provided with multiple grooves 2a4a that open at the top portion of the protrusion 2a4. Further, a hole through which the cooling gas 3a1 is discharged can also be provided in the protrusion 2a4.

Similar to the protrusion 2a3 described above, in a plan view, a part of the protrusion 2a4 may be provided inside the region where the substrate 103 is provided, and the remaining part is provided outside the region where the substrate 103 may be provided. Further, in a plan view, the protrusion 2a4 can be located in the vicinity of the region where the substrate 103 is provided. In this case, the surfaces of the multiple protrusions 2a4 on the substrate 103 side may be located on the boundary line of the region where the substrate 103 is provided.

Further, in a plan view, the protrusion 2a4 can have a shape extending along the boundary line of the region where the substrate 103 is provided (a shape extending along the peripheral edge of the mounted substrate 103). Although the case where the protrusion 2a4 is not provided at the position where the support portion 2a2 is provided is illustrated, it is also possible to provide one annular protrusion 2a4. In this case, the support portion 2a2 can be provided on the top portion of the annular protrusion 2a4.

Similar to the protrusion 2a3 described above, a slight gap (for example, 1 mm or less) may be provided between the top portion of the protrusion 2a4 and the back surface 103a of the substrate 103. Further, at least a part of the top portion of the protrusion 2a4 may be brought into contact with the back surface 103a of the substrate 103.

The dimensions of the gap between the top of the protrusion 2a4 and the back surface 103a of the substrate 103, the arrangement of the gap, and the like can be the same as in the case of the protrusion 2a3 described above.

Also in the case of the protrusion 2a4 according to the embodiment, the same operation as that of the protrusion 2a3 can be obtained. The cooling gas 3a1 supplied from the hole 2aa is changed in the flow direction by hitting the protrusion 2a4, and flows along the protrusion 2a4. Since the protrusion 2a4 has a shape extending along the peripheral edge of the placed substrate 103, the cooling gas 3a1 flows along the peripheral edge of the substrate 103. Cooling is likely to be suppressed in the vicinity of the peripheral edge of the substrate 103 due to a decrease in cooling efficiency or heat input from the external air, but if the protrusion 2a4 is provided, the cooling gas 3a1 is allowed to flow along the peripheral edge of the substrate 103. Therefore, it becomes possible to effectively cool the vicinity of the peripheral edge of the substrate 103.

The cooling gas 3a1 supplied to the inside of the space surrounded by the protrusion 2a4, the placement stand 2a, and the back surface 103a of the substrate 103 is discharged to the outside through multiple grooves 2a4a provided in the protrusion 2a4. The protrusion 2a4 may be divided so that the cooling gas 3a1 is discharged through the gap provided between the protrusion 2a4 and the protrusion 2a4. When the planar shape of the substrate 103 is circular, the cooling gas 3a1 is preferably discharged as evenly as possible from the peripheral edge of the substrate 103 in order to suppress the occurrence of temperature distribution in the region near the peripheral edge of the substrate 103. Therefore, it is preferable to provide the multiple grooves 2a4a and the like from which the cooling gas 3a1 is discharged at equal intervals.

The arrangement of the protrusions and the setting of the gap determine the discharge state of the cooling gas 3a1 supplied to the inside of the space surrounded by the protrusions 2a4, the placement stand 2a, and the back surface 103a of the substrate 103. That is, it also includes determining the outflow (discharge) resistance of the cooling gas 3a1 from the space described above. Then, these conditions can be obtained by conducting experiments and simulations in advance.

Next, returning to FIG. 1, other components provided in the substrate treatment apparatus 1 will be described.

As shown in FIG. 1, one end of the rotating shaft 2b is fitted into the hole 2aa of the placement stand 2a. The other end of the rotating shaft 2b is provided on the outside of the housing 6. The rotating shaft 2b is connected to the drive part 2c outside the housing 6.

The rotating shaft 2b has a tubular shape. A blowout portion 2b1 is provided at the end of the rotating shaft 2b on the placement stand 2a side. The blowout portion 2b1 is open to the surface of the placement stand 2a where multiple supporting portions 2a1 are provided. The opening-side end of the blowout portion 2b1 is connected to the inner wall of the hole 2aa. The opening of the blowout portion 2b1 faces the back surface 100a of the substrate 100 placed on the placement stand 2a.

The blowout portion 2b1 has a shape in which the cross-sectional area increases toward the placement stand 2a side (opening side). Therefore, the cross-sectional area of the hole inside the blowout portion 2b1 increases toward the placement stand 2a side (opening side). Although the case where the blowout portion 2b1 is provided at the tip of the rotating shaft 2b has been illustrated, the blowout portion 2b1 can also be provided at the tip of the cooling nozzle 3d described later. Further, the hole 2aa of the placement stand 2a can be used as the blowing portion 2b1.

If the blowing portion 2b1 is provided, the released cooling gas 3a1 can be supplied to a wider area of the back surface 100a of the substrate 100. In addition, the release rate of the cooling gas 3a1 can be reduced. Therefore, it is possible to suppress the substrate 100 from being partially cooled or the cooling rate of the substrate 100 from becoming too fast. As a result, it becomes easy to generate a supercooled state of the liquid 101, which will be described later. Further, the supercooled state of the liquid 101 can be generated in a wider region of the surface 100b of the substrate 100. Therefore, the removal ratio of contaminations can be improved.

A cooling nozzle 3d is attached to the end of the rotating shaft 2b on the side opposite to the placement stand 2a side. A rotating shaft seal (not shown) is provided between the end of the rotating shaft 2b on the side opposite to the placement stand 2a side and the cooling nozzle 3d. Therefore, the end of the rotating shaft 2b on the side opposite to the placement stand 2a side is sealed so as to be airtight.

The drive part 2c is provided outside the housing 6. The drive part 2c is connected to the rotating shaft 2b. The drive part 2c can have a rotating device such as a motor. The rotational force of the drive part 2c is transmitted to the placement stand 2a via the rotation shaft 2b. Therefore, the drive part 2c can rotate the placement stand 2a and, in addition, the substrate 100 placed on the placement stand 2a.

Further, the drive part 2c can not only start and stop the rotation but also change the rotations per minute (rotational speed). The drive part 2c may be provided with a control motor such as a servo motor, for example.

The cooling part 3 supplies the cooling gas 3a1 to the space between the placement stand 2a and the back surface 100a of the substrate 100. The cooling part 3 includes a coolant part 3a, a filter 3b, a flow rate controller 3c, and a cooling nozzle 3d. The coolant part 3a, the filter 3b, and the flow rate controller 3c are provided outside the housing 6.

The coolant part 3a stores the coolant and generates the cooling gas 3a1. The coolant is a liquefied cooling gas 3a1. The cooling gas 3a1 is not particularly limited as long as it is a gas that does not easily react with the material of the substrate 100. The cooling gas 3a1 can be, for example, an inert gas such as nitrogen gas, helium gas, or argon gas.

In this case, the cooling time of the substrate 100 can be shortened by using a gas having a high specific heat. For example, if helium gas is used, the cooling time of the substrate 100 can be shortened. Further, if nitrogen gas is used, the treatment cost of the substrate 100 can be reduced.

The coolant part 3a includes a tank for storing the coolant and a vaporizer for vaporizing the coolant stored in the tank. The tank is provided with a cooling device for maintaining the temperature of the coolant. The vaporizer raises the temperature of the coolant to generate the cooling gas 3a1 from the coolant. For the vaporizer, for example, the outside air temperature can be used, or heating with a heat medium can be used. The temperature of the cooling gas 3a1 may be a temperature equal to or lower than the freezing point of the liquid 101, and can be, for example, −170° C.

Although the case where the coolant part 3a generates the cooling gas 3a1 by vaporizing the coolant stored in the tank is illustrated, it is also possible to cool the nitrogen gas or the like with a chiller or the like to obtain the cooling gas 3a1. By doing so, the coolant portion can be simplified.

The filter 3b is connected to the coolant part 3a via a pipe. The filter 3b suppresses the outflow of contaminations such as particles included in the coolant to the substrate 100 side.

The flow rate controller 3c is connected to the filter 3b via a pipe. The flow rate controller 3c controls the flow rate of the cooling gas 3a1. The flow rate controller 3c can be, for example, an MFC (Mass Flow Controller) or the like. Further, the flow rate controller 3c may indirectly control the flow rate of the cooling gas 3a1 by controlling the supply pressure of the cooling gas 3a1. In this case, the flow rate controller 3c can be, for example, an APC (Auto Pressure Controller).

The temperature of the cooling gas 3a1 generated from the coolant in the coolant part 3a is substantially a predetermined temperature. Therefore, the flow rate controller 3c can control the flow rate of the cooling gas 3a1 to control the temperature of the substrate 100 and, in addition, the temperature of the liquid 101 on the surface 100b of the substrate 100. In this case, by controlling the flow rate of the cooling gas 3a1 by the flow rate controller 3c, the supercooled state of the liquid 101 can be generated in a supercooling process described later.

The cooling nozzle 3d has a tubular shape. One end of the cooling nozzle 3d is connected to the flow controller 3c. The other end of the cooling nozzle 3d is provided inside the rotating shaft 2b. The other end of the cooling nozzle 3d is located near the end of the blowout portion 2b1 opposite to the placement stand 2a side (opening side).

The cooling nozzle 3d supplies the cooling gas 3a1 whose flow rate is controlled by the flow rate controller 3c to the substrate 100. The cooling gas 3a1 discharged from the cooling nozzle 3d is directly supplied to the back surface 100a of the substrate 100 via the blowout portion 2b1.

The first liquid supplier 4 supplies the liquid 101 to the surface 100b of the substrate 100. In the freezing process described later, when the liquid 101 undergoes a phase change from a liquid to a solid, the volume changes, so that a pressure wave is generated. It is considered that the contaminations adhering to the surface 100b of the substrate 100 are separated by this pressure wave. Therefore, the liquid 101 is not particularly limited as long as it does not easily react with the material of the substrate 100. The state in which the liquid 101 and the frozen liquid 101 are present as a whole is referred to as a "solid-liquid phase".

If the liquid 101 is a liquid whose volume increases when it is frozen, it is considered that the contaminations adhering to the surface of the substrate 100 can be separated by utilizing the physical force accompanying the volume increase. Therefore, it is preferable that the liquid 101 is a liquid that does not easily react with the material of the substrate 100 and whose volume increases when frozen. For example, the liquid 101 can be water (for example, pure water, ultrapure water, etc.), a liquid including water as a main component, or the like.

When a liquid containing water as a main component is used, if the amount of components other than water is too large, it becomes difficult to utilize the physical force associated with the increase in volume, so that the removal ratio of contaminations may decrease. Therefore, the concentration of components other than water is preferably not less than 5 wt % and not more than 30 wt %.

Further, the gas can be dissolved in the liquid 101. The gas can be, for example, carbon dioxide gas, ozone gas, hydrogen gas, or the like. If carbon dioxide gas is dissolved in the liquid 101, the conductivity of the liquid 101 can be increased, so that electrification removal or electrification prevention of the substrate 100 can be performed. If ozone gas is dissolved in the liquid 101, contaminations made of organic substances can be dissolved.

The first liquid supplier 4 includes a liquid storage part 4a, a supplier 4b, a flow rate controller 4c, and a liquid nozzle 4d. The liquid storage part 4a, the supplier 4b, and the flow rate controller 4c are provided outside the housing 6.

The liquid storage part 4a stores the liquid 101 described above. The liquid 101 is stored in the liquid storage part 4a at a temperature higher than the freezing point. The liquid 101 is stored at room temperature (20° C.), for example.

The supplier 4b is connected to the liquid storage part 4a via a pipe. The supplier 4b supplies the liquid 101 stored in the liquid storage part 4a toward the liquid nozzle 4d. The supplier 4b can be, for example, a pump having resistance to the liquid 101. Although the case where the supplier 4b is a pump has been illustrated, the supplier 4b is not limited to the pump. For example, the supplier 4b may supply gas to the inside of the liquid storage part 4a and pump the liquid 101 stored in the liquid storage part 4a.

The flow rate controller 4c is connected to the supplier 4b via a pipe. The flow rate controller 4c controls the flow rate of the liquid 101 supplied by the supplier 4b. The flow rate controller 4c can be, for example, a flow rate control valve. In addition, the flow rate controller 4c can also start and stop the supply of the liquid 101.

The liquid nozzle 4d is provided inside the housing 6. The liquid nozzle 4d has a tubular shape. One end of the liquid nozzle 4d is connected to the flow controller 4c via a pipe. The other end of the liquid nozzle 4d faces the surface 100b of the substrate 100 placed on the placement stand 2a. Therefore, the liquid 101 discharged from the liquid nozzle 4d is supplied to the surface 100b of the substrate 100.

The other end of the liquid nozzle 4d (the discharge port of the liquid 101) is faced substantially in the center of the surface 100b of the substrate 100. The liquid 101 discharged from the liquid nozzle 4d spreads from substantially the center of the surface 100b of the substrate 100, and a liquid film having a substantially constant thickness is formed on the surface 100b of the substrate 100. In the following, the film of the liquid 101 formed on the surface 100b of the substrate 100 will be referred to as a liquid film.

The second liquid supplier 5 supplies the liquid 102 to the surface 100b of the substrate 100. The second liquid supplier 5 includes a liquid storage part 5a, a supplier 5b, a flow rate controller 5c, and a liquid nozzle 4d.

The liquid 102 can be used in the thawing process described later. Therefore, the liquid 102 is not particularly limited as long as it does not easily react with the material of the substrate 100 and does not easily remain on the surface 100b of the substrate 100 in the drying process described later. The liquid 102 can be, for example, water (for example, pure water, ultrapure water, etc.), a mixed solution of water and alcohol, or the like.

The liquid storage part 5a can be the same as the liquid storage part 4a described above. The supplier 5b can be the same as the supplier 4b described above. The flow rate controller 5c can be the same as the flow rate controller 4c described above.

When the liquid 102 and the liquid 101 are the same, the second liquid supplier 5 can be omitted. Further, although the case where the liquid nozzle 4d is also shared is illustrated, a liquid nozzle for discharging the liquid 101 and a liquid nozzle for discharging the liquid 102 may be provided separately.

Further, the temperature of the liquid 102 can be higher than the freezing point of the liquid 101. Further, the temperature of the liquid 102 can be set to a temperature at which the frozen liquid 101 can be thawed. The temperature of the liquid 102 can be, for example, about room temperature (20° C.).

When the second liquid supplier 5 is omitted, the first liquid supplier 4 is used in the thawing process. That is, the liquid 101 is used. The temperature of the liquid 101 can also be a temperature at which the frozen liquid 101 can be thawed. The temperature of the liquid 101 can be, for example, about room temperature (20° C.).

The housing 6 has a box shape. A cover 6a is provided inside the housing 6. The cover 6a receives the liquids 101 and 102 supplied to the substrate 100 and discharged to the outside of the substrate 100 by rotating the substrate 100. The cover 6a has a tubular shape. The vicinity of the end of the cover 6a opposite to the placement stand 2a side (near the upper end of the cover 6a) is bent toward the center of the cover 6a. Therefore, it is possible to easily capture the liquids 101 and 102 scattered above the substrate 100.

Further, a partition plate 6b is provided inside the housing 6. The partition plate 6b is provided between the outer surface of the cover 6a and the inner surface of the housing 6.

Multiple discharge ports 6c are provided on the bottom surface side of the housing 6. In the case of the housing 6 illustrated in FIG. 1, two discharge ports 6c are provided.

The used cooling gas 3a1, air 7a, liquid 101, and liquid 102 are discharged from the discharge port 6c to the outside of the housing 6. An exhaust pipe 6c1 is connected to the discharge port 6c, and an exhaust part (pump) 11 for exhausting the used cooling gas 3a1 and air 7a is connected to the exhaust pipe 6c1. Further, a discharge pipe 6c2 for discharging the liquids 101 and 102 is connected to the discharge port 6c.

The discharge port 6c is provided below the substrate 100. Therefore, the cooling gas 3a1 is exhausted from the discharge port 6c to create a downflow flow. As a result, it is possible to prevent the particles from soaring.

In a plan view, the multiple discharge ports 6c are provided so as to be symmetrical with respect to the center of the housing 6. In this way, the exhaust direction of the cooling gas 3a1 becomes symmetrical with respect to the center of the housing 6. If the exhaust directions of the cooling gas 3a1 are symmetrical, the exhaust of the cooling gas 3a1 becomes smooth.

The blower part 7 is provided on the ceiling surface of the housing 6. The blower part 7 may be provided on the side surface of the housing 6 as long as it is on the ceiling side. The blower part 7 can include a filter and a blower such as a fan. The filter can be, for example, a HEPA filter (High Efficiency Particulate Air Filter) or the like.

The blower part 7 supplies air 7a (outside air) to the space between the partition plate 6b and the ceiling of the housing 6. Therefore, the pressure in the space between the partition plate 6b and the ceiling of the housing 6 becomes higher than the external pressure. As a result, it becomes easy to guide the air 7a supplied by the blower part 7 to the discharge port 6c. In addition, it is possible to prevent contaminations such as particles from entering the inside of the housing 6 from the discharge port 6c.

Further, the blower part 7 supplies the air 7a at room temperature to the surface 100b of the substrate 100. Therefore, the blower part 7 can change the temperature of the liquids 101 and 102 on the substrate 100 by controlling the supply amount of the air 7a. Therefore, the blower part 7 can control the supercooled state of the liquid 101 in the supercooling process described later, promote the thawing of the liquid 101 in the thawing process, or promote the drying of the liquid 102 in the drying process.

The measuring part 8 is provided in the space between the partition plate 6b and the ceiling of the housing 6. The measuring part 8 measures the temperature of the liquid 101 on the surface 100b of the substrate 100. In this case, the measuring part 8 can be, for example, a temperature sensor such as a radiation thermometer, a thermoviewer, a thermocouple, or a resistance temperature detector. Further, the measuring part 8 may measure the thickness of the liquid 101 (thickness of the liquid film) on the surface 100b of the substrate 100. In this case, the measuring part 8 can be, for example, a laser displacement meter, an ultrasonic displacement meter, or the like. The measured temperature and thickness of the liquid 101 can be used to control the supercooled state of the liquid 101 in the supercooling process described later.

Note that controlling the supercooled state means controlling the curve of the temperature change of the liquid 101 in the supercooled state so that the liquid 101 is not frozen due to rapid cooling, that is, the supercooled state is maintained.

The controller 9 controls the operation of each element provided in the substrate treatment device 1. The controller 9 can include, for example, a computational element such as a CPU (Central Processing Unit) and a memory element such as a semiconductor memory. The controller 9 can be, for example, a computer. A control program for controlling the operation of each element provided in the substrate treatment device 1 can be stored in the memory element. The computational element controls the operation of each element provided in the substrate treatment device 1 by using a control program stored in the memory element, data input by the operator, data from the measurement part 8, and the like.

For example, the cooling rate of the liquid 101 correlates with the thickness of the liquid film. For example, the thinner the liquid film, the faster the cooling rate of the liquid 101. On the contrary, the thicker the liquid film, the slower the cooling rate of the liquid 101. Therefore, the controller 9 can control the flow rate of the cooling gas 3a1 and the cooling rate of the liquid 101 based on the thickness of the liquid 101 (thickness of the liquid film) measured by the measurement part 8. The temperature and cooling rate of the liquid 101 are controlled when the supercooled state of the liquid 101 is controlled in the supercooling process described later. Therefore, for example, the controller 9 can control the rotation of the substrate 100, the flow rate of the cooling gas 3a1, and the supply amount of the liquid 101.

Next, the operation of the substrate treatment device 1 will be illustrated.

Figure 7:
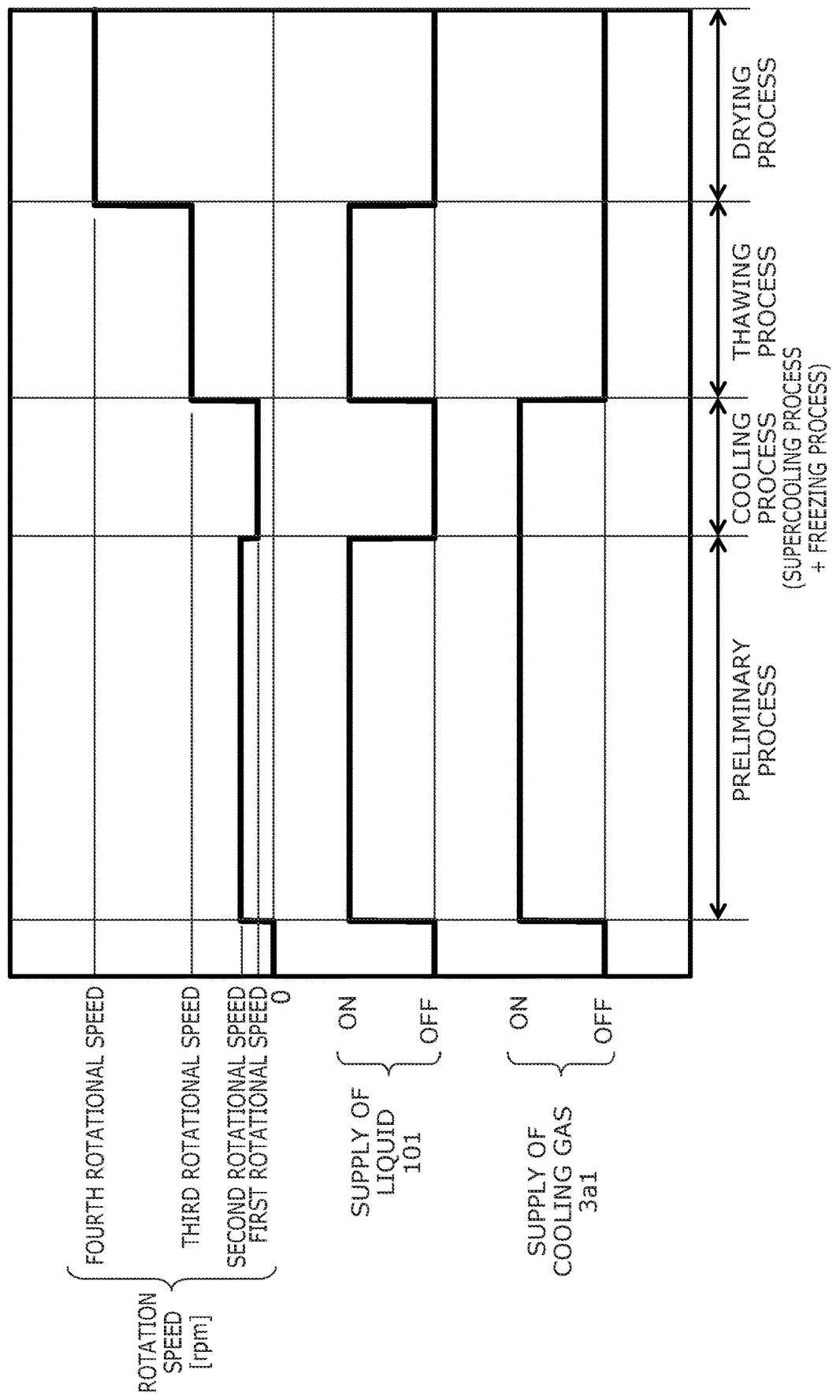
FIG. 7 is a timing chart for illustrating the operation of the substrate treatment device.

FIG. 7 is a timing chart for illustrating the operation of the substrate treatment device 1.

Note that FIG. 7 shows a case where the substrate 100 is a 6025 quartz (Qz) substrate (152 mm×152 mm×6.35 mm) and the liquid 101 is pure water.

First, the substrate 100 is carried into the inside of the housing 6 through a carry-in/carry-out port (not shown) of the housing 6. The carried-in substrate 100 is placed and supported on multiple support portions 2a1 of the placement stand 2a.

After the substrate 100 is supported by the placement stand 2a, a freeze cleaning process including a preliminary process, a cooling process (supercooling process+freezing process), a thawing process, and a drying process is performed as shown in FIG. 7.

First, the preliminary process is performed as shown in FIG. 7. In the preliminary process, the controller 9 controls the supplier 4b and the flow rate controller 4c to supply the liquid 101 at a predetermined flow rate to the surface 100b of the substrate 100. Further, the controller 9 controls the flow rate controller 3c to supply the cooling gas 3a1 having a predetermined flow rate to the back surface 100a of the substrate 100. Further, the controller 9 controls the drive part 2c to rotate the substrate 100 at the second rotation speed.

Therefore, the liquid 101 is poured onto the rotating substrate 100.

For example, in the case of the one illustrated in FIG. 7, the rotation speed of the substrate 100 can be, for example, about 50 rpm to 500 rpm as the second rotation speed. The flow rate of the liquid 101 can be about 0.1 L/min to 1.0 L/min. The flow rate of the cooling gas 3a1 can be about 40 NL/min to 200 NL/min. In addition, the process time of the preliminary process can be set to about 1800 seconds. The process time of the preliminary process may be any time as long as the in-plane temperature of the substrate 100 becomes substantially uniform, and can be obtained by conducting experiments or simulations in advance.

The temperature of the liquid film in the preliminary process is substantially the same as the temperature of the supplied liquid 101 because the liquid 101 is in a flowing state. For example, when the temperature of the supplied liquid 101 is about room temperature (20° C.), the temperature of the liquid film is about room temperature (20° C.).

Next, as shown in FIG. 7, a cooling process (supercooling process+freezing process) is executed. In the embodiment, in the cooling process, the process from the supercooling state of the liquid 101 to the start of freezing is called the "supercooling step", and the process from the frozen state of the supercooled liquid 101 to the start of thawing of the thawing process is called the "freezing process".

Here, if the cooling rate of the liquid 101 becomes too high, the liquid 101 does not become a supercooled state and freezes immediately. Therefore, the controller 9 controls at least one of the flow rate of the cooling gas 3a1, and the rotation speed of the substrate 100, so that the liquid 101 on the surface 100b of the substrate 100 becomes supercooled.

In the cooling process (supercooling process+freezing process), as illustrated in FIG. 7, the supply of the liquid 101 supplied in the preliminary process is stopped after the first rotation speed is set. The rotation speed of the substrate 100 is about 0 rpm to 50 rpm. The first rotation speed is such that the liquid 101 supplied from the supplier 4b spreads on the surface 100b of the substrate 100 to form a liquid film having a uniform thickness, and the liquid film having a uniform thickness is maintained. That is, the controller 9 rotates the substrate 100 at a rotation speed lower than the rotation speed at the time of the preliminary process. The thickness of the liquid film of the liquid 101 at this time can be equal to or greater than the height dimension of the uneven portion provided on the surface 100b of the substrate 100. When the thickness of the liquid film is thin, it may be difficult to supercool. In such a case, the thickness of the liquid film may be approximately 100 μm or more. It is preferable to appropriately determine the specific rotation speed conditions by conducting experiments and simulations. Further, the flow rate of the cooling gas 3a1 is maintained at the same level as in the preliminary process.

In this way, in the cooling process (supercooling process+freezing process), the liquid 101 on the substrate 100 is made to stagnate by stopping the supply of the liquid 101, and controlling the rotation speed of the substrate 100 to be set to the first rotation speed which is lower than the second rotation speed. Therefore, the temperature of the liquid film on the substrate 100 is further lowered from the temperature of the liquid film in the preliminary process due to the cooling gas 3a1 continuously supplied to the back surface 100a of the substrate 100, resulting in a supercooled state. The preliminary process may be carried out at the first rotation speed, and the supply of the liquid 101 may be stopped when the in-plane temperature of the substrate 100 becomes uniform.

The conditions under which the liquid 101 is in the supercooled state are affected by the size of the substrate 100, the viscosity of the liquid 101, the specific heat of the cooling gas 3a1, and the like. Therefore, it is preferable to appropriately determine the control conditions for the liquid 101 to be in the supercooled state by conducting an experiment or a simulation.

In the supercooled state, freezing of the liquid 101 starts due to, for example, the temperature of the liquid film, the presence of bubbles and contaminations such as particles, and vibration. For example, in the presence of contaminations such as particles, freezing of the liquid 101 starts when the temperature T of the liquid 101 becomes not lower than −35° C. and not higher than −20° C. Further, freezing of the liquid 101 can be started by applying vibration to the liquid 101 by varying the rotation of the substrate 100.

When freezing of the liquid 101 in the supercooled state starts, the process shifts from the supercooling process to the freezing process. In the freezing process, the liquid 101 and the frozen liquid 101 exist on the surface 100*b* of the substrate 100. The cooling gas 3*a*1 continuously supplied to the back surface 100*a* of the substrate 100 further lowers the temperature of the liquid film on the substrate 100 in the freezing process, and completely freezes to form an ice film.

The conditions for freezing the supercooled liquid 101 are not limited to those illustrated. For example, the flow rate of the cooling gas 3*a*1 may be increased. Further, the liquid 101 may be frozen by applying vibration to the liquid 101 in the supercooled state. For example, an ultrasonic generator that changes the rotation speed of the substrate 100 or vibrates the liquid 101 on the substrate 100 indirectly or directly via the rotation shaft 2*b* or the like can be provided.

Next, the thawing process is performed as shown in FIG. 7. In addition, FIG. 7 illustrate a case where the liquid 101 and the liquid 102 are the same liquid. Therefore, it is described as liquid 101 in FIG. 7. In the thawing process, the controller 9 controls the supplier 4*b* and the flow rate controller 4*c* to supply the liquid 101 at a predetermined flow rate to the surface 100*b* of the substrate 100. When the liquid 101 and the liquid 102 are different, the controller 9 controls the supplier 5*b* and the flow rate controller 5*c* to supply the liquid 102 at a predetermined flow rate to the surface 100*b* of the substrate 100.

Further, the controller 9 controls the flow rate controller 3*c* to stop the supply of the cooling gas 3*a*1. Further, the controller 9 controls the drive part 2*c* to increase the rotation speed of the substrate 100 to the third rotation speed. The third rotation speed can be, for example, about 200 rpm to 700 rpm. If the rotation of the substrate 100 becomes faster, the liquid 101 and the frozen liquid 101 can be shaken off by centrifugal force. Therefore, the liquid 101 and the frozen liquid 101 can be discharged from the surface 100*b* of the substrate 100. At this time, the contaminations separated from the surface 100*b* of the substrate 100 are also discharged together with the liquid 101 and the frozen liquid 101.

The supply amount of the liquid 101 or the liquid 102 is not particularly limited as long as it can be thawed. Further, the third rotation speed of the substrate 100 is not particularly limited as long as the liquid 101, the frozen liquid 101, and the contaminations can be discharged.

Further, the start of thawing does not necessarily have to be performed on the ice film, and for example, thawing may be started when the liquid 101 is at least partially frozen from the supercooled state.

Next, the drying process is performed as shown in FIG. 7. In the drying process, the controller 9 controls the supplier 4*b* and the flow rate controller 4*c* to stop the supply of the liquid 101. When the liquid 101 and the liquid 102 are different liquids, the controller 9 controls the supplier 5*b* and the flow rate controller 5*c* to stop the supply of the liquid 102.

Further, the controller 9 controls the drive part 2*c* to increase the rotation speed of the substrate 100 to a fourth rotation speed faster than the third rotation speed. If the rotation of the substrate 100 becomes faster, the substrate 100 can be dried quickly. The fourth rotation speed of the substrate 100 is not particularly limited as long as the substrate 100 can be dried.

The substrate 100 that has been freeze-cleaned is carried out of the housing 6 through a carry-in/carry-out port (not shown) of the housing 6.

By doing the above, the processing of the substrate 100 (removal of contamination) can be performed.

Here, as described above, cooling of the vicinity of the peripheral edge of the substrate 100 is likely to be suppressed due to a decrease in cooling efficiency or heat input from the external air. Since the placement stand 2*a* according to the embodiment is provided with the protrusions 2*a*3, the cooling gas 3*a*1 supplied from the holes 2*aa* can flow along the peripheral edge of the substrate 100. Therefore, since the cooling in the vicinity of the peripheral edge of the substrate 100 can be effectively performed, it is possible to suppress a decrease in the removal ratio of contaminations in the vicinity of the peripheral edge of the substrate 100.

Further, in the substrate treatment device 1 according to the embodiment, the cooling gas 3*a*1 is supplied to the back surface 100*a* of the substrate 100 to cool the liquid 101 supplied to the surface 100*b* of the substrate 100. In this case, for example, when the cooling gas 3*a*1 is supplied to the surface 100*b* side of the substrate 100, local freezing may occur in the liquid film. On the other hand, when the cooling gas 3*a*1 is supplied to the back surface 100*a* side of the substrate 100, the liquid film can be cooled through the substrate 100, so that local freezing of the liquid film can be suppressed. Therefore, since the pressure applied between the uneven portions provided on the surface 100*b* of the substrate 100 can be made uniform, the collapse (damage) of the uneven portions can be suppressed. Further, since the liquid 101 is not blown off by the supplied cooling gas 3*a*1, freezing can be performed while maintaining the film thickness.

Further, since cooling proceeds in the thickness direction from the back surface 100*a* of the substrate 100 toward the surface 100*b*, the temperature at the interface between the surface 100*b* of the substrate 100 and the liquid 101 can be the lowest, even if the liquid film has a temperature gradient in the thickness direction. Therefore, freezing of the liquid 101 is started from a side of the interface between the surface 100*b* of the substrate 100 and the liquid 101. Further, since the temperature of the liquid 101 near the interface can be set to the lowest level, the expansion of the frozen liquid 101 can be increased near the interface. Therefore, contaminants adhering to the surface 100*b* of the substrate 100 can be efficiently separated.

Figure 8:
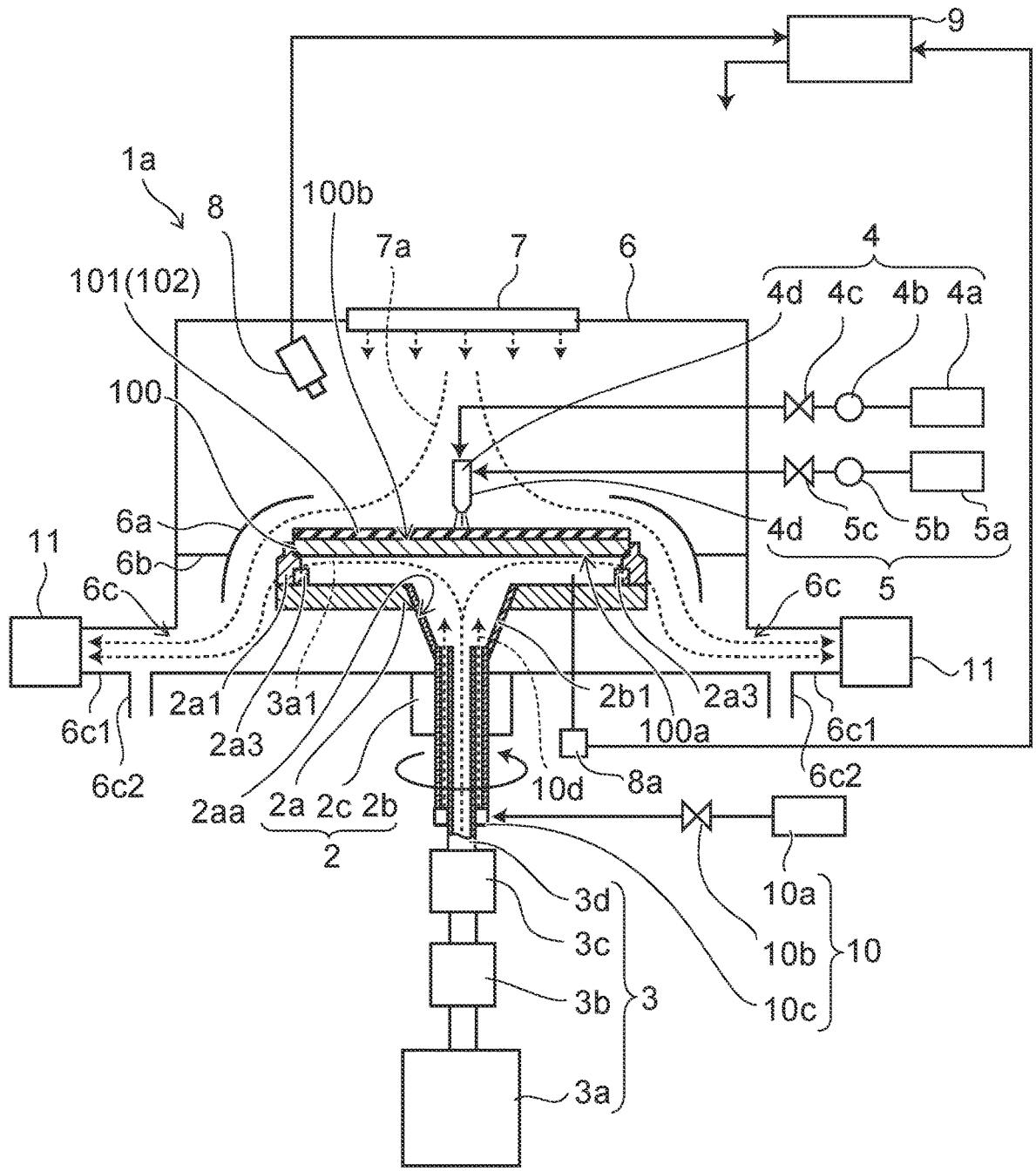
FIG. 8 is a schematic view for illustrating a substrate treatment device according to the other embodiment.

FIG. 8 is a schematic view for illustrating the substrate treatment device 1*a* according to another embodiment.

As shown in FIG. 8, a substrate treatment device 1*a* includes the placement part 2, the cooling part 3, the first liquid supplier 4, the second liquid supplier 5, the housing 6, the blower part 7, the measurement part 8, and a temperature measurement part 8*a*, a gas supplier 10, the exhaust part 11, and the controller 9.

The temperature measurement part 8*a* detects the temperature of the space between the substrate 100 and the placement stand 2*a*. This temperature is substantially equal to the temperature of the mixed gas (gas in which the cooling gas 3*a*1 and the gas 10*d* are mixed) flowing between the substrate 100 and the placement stand 2*a*. The temperature detector 8*a* can be, for example, a radiation thermometer, a thermoviewer, a thermocouple, a resistance temperature detector, or the like.

The gas supplier 10 includes a gas storage part 10*a*, a flow rate controller 10*b*, and a connection part 10*c*.

The gas storage part 10*a* stores and supplies the gas 10*d*. The gas storage part 10*a* can be a high-pressure cylinder or factory piping in which the gas 10*d* is stored.

The flow rate controller 10*b* controls the flow rate of the gas 10*d*. The flow rate controller 10*b* can be, for example, an MFC that directly controls the flow rate of the gas 10d, or an APC that indirectly controls the flow rate of the gas 10d by controlling the pressure.

The connecting part 10c is connected to the rotating shaft 2b. The connection part 10c connects the flow rate controller 10b and the space between the rotating shaft 2b and the cooling nozzle 3d. The connecting part 10c can be, for example, a rotary joint.

The gas 10d is not particularly limited as long as it is a gas that does not easily react with the material of the substrate 100. The gas 10d can be, for example, an inert gas such as nitrogen gas, helium gas, or argon gas. In this case, the gas 10d can be the same gas as the cooling gas 3a1. However, the temperature of the gas 10d is higher than the temperature of the cooling gas 3a1. The temperature of the gas 10d can be, for example, room temperature.

If the cooling rate of the liquid 101 becomes too high, the liquid 101 will not be in a supercooled state and will freeze immediately. That is, the supercooling process cannot be performed. In this case, the cooling rate of the liquid 101 can be controlled by at least one of the rotation speed of the substrate 100 and the flow rate of the cooling gas 3a1. However, the temperature of the cooling gas 3a1 becomes substantially constant depending on the temperature setting in the cooling part that supplies the cooling gas 3a1. Therefore, it may be difficult to decrease the cooling rate of the liquid 101 at the flow rate of the cooling gas 3a1.

Further, if the rotation speed of the substrate 100 is reduced, the thickness of the liquid film becomes thicker, so that the cooling rate can be decreased. However, since the thickness of the liquid film has a limit thickness that can be maintained by surface tension, it may be difficult to decrease the cooling rate of the liquid 101 at the rotation speed of the substrate 100.

Therefore, in the embodiment, the cooling rate of the liquid 101 can be decreased by mixing the gas 10d having a temperature higher than that of the cooling gas 3a1 and the cooling gas 3a1. The cooling rate of the liquid 101 can be controlled by the flow rate of the gas 10d and the cooling gas 3a1, the mixing ratio of the gas 10d and the cooling gas 3a1, the temperature of the gas 10d, and the like.

By mixing the cooling gas 3a1 with the gas 10d having a temperature higher than that of the cooling gas 3a1, the temperature of the gas supplied to the space between the substrate 100 and the mounting table 2a can be adjusted more precisely. Therefore, the cooling temperature of the substrate 100 can be adjusted with higher accuracy. Moreover, the supercooled state of the liquid 101 can be controlled more easily.

Further, as described above, the in-plane temperature of the substrate 100 can be made uniform by the protrusions 2a3. Therefore, the supercooled state of the liquid 101 can be controlled more easily, and the removal ratio of contaminations is improved.

Further, even if the measurement part 8 detects the temperature of the liquid film and controls the flow rate of the cooling gas 3a1, the temperature on the front surface 100b side of the substrate 100 (the temperature of the liquid film) and the temperature on the back surface 100a side of the substrate 100 may be different. Therefore, if the flow rate of the cooling gas 3a1 is controlled only based on the temperature of the liquid film detected by the measurement part 8, even if the temperature of the liquid film becomes an appropriate temperature, the temperature of the liquid film and the temperature of the back surface 100a of the substrate 100 may be different, and the temperature gradient in the thickness direction of the substrate 100 may become large.

When the temperature gradient in the thickness direction of the substrate 100 becomes large, the density change due to the non-uniform temperature may be the starting point of freezing, and therefore the freezing timing may vary for every substrate 100.

According to the embodiment, the controller 9 can control at least one of the flow rate of the gas 10d and the cooling gas 3a1 and the mixing ratio of the gas 10d and the cooling gas 3a1 based on the temperature measured by the temperature measurement part 8a.

Therefore, the controller 9 performs such control in the preliminary process, and can switch from the preliminary process to the supercooling process (stopping the supply of the liquid 101) after the difference between the temperature detected by the measurement part 8 and the temperature detected by the temperature measurement part 8a is within a predetermined range. By doing so, freezing can be started in a state where the temperature gradient in the thickness direction of the substrate 100 is small, so that it is possible to suppress variations in the freezing timing.

Further, as described above, the in-plane temperature of the substrate 100 can be made uniform by the protrusions 2a3. Therefore, the supercooled state of the liquid 101 can be controlled more easily, and the removal ratio of contaminations is improved.

It is also possible to control the supercooled state of the liquid 101 by controlling the flow rate of the gas 10d supplied from the gas supplier 10 without controlling the flow rate of the cooling gas 3a1 (the flow rate of the cooling gas 3a1 is kept constant) by the flow rate controller 3c. In such a case, the flow rate controller 3c can be omitted. However, if the flow rate controller 3c and the gas supplier 10 are provided, the supercooled state of the liquid 101 can be controlled more easily.

Further, the supercooled state of the liquid 101 can also be controlled by controlling the amount of air 7a supplied by the blower part 7.

The embodiments have been illustrated. However, the invention is not limited to these embodiments. For example, any addition, deletion, or design change of components, or any addition, omission, or condition change of processes in the above embodiments suitably made by those skilled in the art are also encompassed within the scope of the invention as long as they fall within the spirit of the invention.

For example, the shape, size, number, arrangement, and the like of each component included in the substrate treatment device 1 are not limited to those illustrated, and can be appropriately changed.

What is claimed is:
1. A substrate treatment device, comprising:
a placement stand having a plate shape, and being configured to rotate;
a plurality of support portions provided on one surface of the placement stand and supporting a substrate, a planar shape of the substrate being a substantially quadrangle, each of the plurality of support portions supporting a corner part of the substrate;
a liquid supplier configured to supply a liquid onto a surface of the substrate supported by the support portions, the surface of the substrate being a surface opposite to the placement stand side of the substrate, a film of the liquid being formed by the liquid supplied onto the surface of the substrate;
a cooling part configured to supply a cooling gas into a space between the placement stand and a back surface of the substrate supported by the support portions, the film of the liquid becoming supercooled by the supplied cooling gas and then freezing;

a protrusion provided on the one surface of the placement stand, the protrusion provided at a position on or near a boundary line of a region where the substrate supported by the plurality of support portions is provided in a plan view, the protrusion extending along the boundary line, the protrusion being not provided at a position of the corner part of the substrate, a gap being configure to be formed between a top portion of the protrusion and the back surface of the substrate; and a controller controlling the liquid supplier and the cooling part, the controller being configured to perform following steps;

a liquid film forming step of forming a liquid film by supplying the liquid toward the surface of the substrate, a supercooling step in which the liquid film on the surface of the substrate being supercooled state by the cooling part.

2. The device according to claim 1, wherein
a temperature distribution of the substrate cooled is configured to be controlled by at least one of an overflow resistance of the cooling gas flowing out from a space surrounded by the placement stand, the back surface of the substrate and the protrusion through the gap, a size of an opening of the gap, and a position of the gap.

3. The device according to claim 1, wherein in a plan view, the protrusion is provided inside the region where the substrate is provided.

4. The device according to claim 1, wherein
in a plan view, a portion of the protrusion is provided inside the region where the substrate is provided, and a remaining portion of the protrusion is provided outside the region where the substrate is provided.

5. The device according to claim 1, wherein
in a plan view, the protrusion is provided outside the region where the substrate is provided.

* * * * *